(12) United States Patent
Fries et al.

(10) Patent No.: US 7,656,673 B1
(45) Date of Patent: Feb. 2, 2010

(54) WIRELESS MICRO-ELECTRO-OPTO-FLUIDIC-MECHANICAL FOLDABLE FLEX SYSTEM

(75) Inventors: David P. Fries, St. Petersburg, FL (US); Thomas Weller, Lutz, FL (US)

(73) Assignee: University of South Florida, Tampa, FL (US)

(*) Notice: Subject to any disclaimer, the term of this patent is extended or adjusted under 35 U.S.C. 154(b) by 201 days.

(21) Appl. No.: 10/908,760

(22) Filed: May 25, 2005

Related U.S. Application Data

(60) Provisional application No. 60/521,566, filed on May 25, 2004.

(51) Int. Cl.
*H05K 1/00* (2006.01)

(52) U.S. Cl. ............... 361/749; 361/398; 361/744; 361/784

(58) Field of Classification Search ............... 361/749, 361/744, 784, 398; 607/60, 45, 30; 600/300, 600/301; 385/14, 89; 137/554; 604/890.1
See application file for complete search history.

(56) References Cited

U.S. PATENT DOCUMENTS

| | | | | |
|---|---|---|---|---|
| 5,220,488 A | * | 6/1993 | Denes | 361/749 |
| 5,241,454 A | * | 8/1993 | Ameen et al. | 361/744 |
| 5,631,988 A | * | 5/1997 | Swirhun et al. | 385/89 |
| 5,936,850 A | * | 8/1999 | Takahashi et al. | 361/784 |
| 6,456,256 B1 | * | 9/2002 | Amundson et al. | 343/873 |
| 6,804,558 B2 | * | 10/2004 | Haller et al. | 607/30 |
| 7,110,627 B2 | * | 9/2006 | Rahman | 385/14 |
| 7,264,617 B2 | * | 9/2007 | Freeman | 604/890.1 |
| 2002/0002390 A1 | * | 1/2002 | Fischell et al. | 607/45 |
| 2005/0205136 A1 | * | 9/2005 | Freeman | 137/554 |
| 2006/0020300 A1 | * | 1/2006 | Nghiem et al. | 607/60 |
| 2006/0030760 A1 | * | 2/2006 | Geiger | 600/301 |

OTHER PUBLICATIONS

JP 2005045489, Aritake S, Feb. 17, 2005JA.*
Fries, D.P., Securing harbor systems, SeaMIST: sea micro integrated system technology, Microsystem Symposium 2002, Ypsilanti, Michigan, Sep. 2002.

* cited by examiner

*Primary Examiner*—Dean A. Reichard
*Assistant Examiner*—Andargie M Aychillhum
(74) *Attorney, Agent, or Firm*—Molly L. Sauter; Smith & Hopen, P.A.

(57) ABSTRACT

The present invention provides a highly miniaturized wireless transceiver employing WLAN technology that offers flexible integration with multiple, generic sensing technologies. The developed wireless system can be readily integrated with existing sensing technology to enable direct sensor-to-internet communication in environments where wired connections are too costly, or otherwise impractical.

16 Claims, 2 Drawing Sheets

WIRELESS MICRO-ELECTRO-OPTO-FLUIDIC-MECHANICAL FOLDABLE FLEX SYSTEM

CROSS REFERENCE TO RELATED APPLICATION

This application claims benefit of pending provisional U.S. Ser. No. 60/521,566 filed on May 25, 2004.

STATEMENT OF GOVERNMENT INTEREST

This work has been supported by Space Missile Defense Command (USAMDC) grant DASG-60-00-C-0089.

SUMMARY OF INVENTION

In accordance with the present invention is provided a wireless micro-electro-opto-fluidic-mechanical foldable flex system. In a specific embodiment, the system includes at least one micro-electro-opto-fluidic-mechanical element, a programmable microprocessor and a wireless telemetry element, the at least one micro-electro-opto-fluidic-mechanical element being in circuit communication with the programmable microprocessor through a plurality of flexible interconnects and the programmable microprocessor being in circuit communication with a wireless telemetry unit through a plurality of flexible interconnects.

The micro-electro-opto-fluidic-mechanical elements are incorporated in the system may be selected from many of a plurality of micro-electro-opto-fluidic-mechanical subsystems currently known in the art, including, but not limited to actuators and sensors.

The flexible interconnects in accordance with the present invention are used to provide the necessary connectivity between the micro-electro-opto-fluidic-mechanical elements, the programmable microprocessor and the wireless telemetry unit of the present invention. While the flexible interconnects may be fabricated of a variety of materials currently known in the art, in a preferred embodiment, they are fabricated of an organic polymer substrate. In a specific embodiment, the flexible interconnects are fabricated of polyimide material. The flexible interconnects or liquid crystal polymer (LCP) in accordance with the present may include fluidic interconnects, optical interconnects, electro/magnetic interconnects, photonic waveguide interconnects or any of a variety of additional interconnects known in the art to provide the necessary connectivity between the subsystem elements. Additionally, the flexible interconnects may be fabricated to include embedded passive elements, thereby eliminating the surface mount components.

Additional components may be included within the wireless micro-electro-opto-fluidic-mechanical folded flex system in accordance with the present invention without departing from the scope of the invention to provide additional functionality. These components may include integrated circuit or onboard battery elements.

In addition to the hardware platform as described, a software system that enables the user to deploy, manage, and collect data from the sensor network is within the scope of the present invention. In accordance with the present invention, the software system may include an operating system, a data collection and reporting system, a network management system, an application programming interface, encryption and security capabilities, authentication functionality, a location positioning system, an inventory control system, address assignment capabilities and power management capabilities.

In an additional embodiment, the foldable flex system in accordance with the present invention may include radio substitutions and supporting software to support additional standards based wireless systems, including, but not limited to ZigBee, WiMAX and Cellular data technologies.

The applications and markets for the micro-electro-opto-fluidic-mechanical foldable flex system in accordance with the present invention can span multiple markets, including National Security, Environmental Monitoring, Industrial Monitoring and Home Systems. Potential applications in the area of homeland security and defense include, (1) biological agent detection, reporting, and tracing, (2) gas detection, reporting, and tracing, (3) water borne contaminant testing and reporting, (4) water supply monitoring for reservoirs, public water supplies, coastal, rivers, lakes, distribution systems, ecological reserves, (5) shipboard monitoring, (6) bio-warfare detection, and (7) battlefield monitoring. Potential applications in the area of environmental monitoring include, (1) water quality monitoring, such as salt-water intrusion in wells, phosphorus runoff from farms, red tide algae blooms, (2) atmosphere monitoring for pollutants, temperature, pressure and humidity, (3) waste water monitoring for sewers, industrial and regulatory enforcement, (4) land moisture and pollution monitoring, (5) environmentally sensitive area monitoring and (6) endangered species monitoring and tracking. Potential applications in the area of industrial monitoring include, (1) food monitoring, inspection and testing, (2) enhancement of RFID data with environmental data, (3) power and utility automation, (4) industrial automation in the fields of temperature sensing and control, pressure sensing, flow control, level sensing and machine health monitoring, (4) industrial chemical process monitoring, (5) industrial chemical leak detection, (6) building automation for use with HVAC, lighting control, access control and refrigeration, (7) indoor air quality monitoring, (8) gas alarms for toxic gas hazard warnings, (9) medical instrumentation and (10) agriculture for use with irrigation systems, toxic agent detection, alkaline/acidity reporting and fertilizer runoff monitoring. Potential applications in the area of consumer products include, (1) water systems, (2) irrigation systems and (3) alarm systems.

The wireless micro-electro-opto-fluidic-mechanical foldable flex system in accordance with the present invention exhibits many unique characteristics and advantages over other system currently known in the art. The present invention is a stand-alone, battery operated system including a programmable microprocessor. Therefore, the system does not require the use of a personal computer or outboard processor to provide a local control or a gateway into the Internet. The present invention is capable of interfacing with multiple sensing types because the platform presents a programmable last metal interconnect grid to allow standard sensors to be easily interconnected into the wireless platform. The sensor interconnections include bi-directional analog and digital interfaces, thereby allowing the local microprocessor to instruct and modify the sensor's behavior. The programmable microprocessor combined with the wireless capability and bi-directional interfaces allow the sensor network to reconfigure and adapt the behavior of the sensor. The sensor is designed using folded flex packaging to allow both horizontal and vertical interconnections between the folds of the package for more efficient component-to-component interconnections. The folded flex packaging in accordance with the present invention allows for simplified tape automated manufacturing. The folded flex packaging also allows for 3D space efficient interconnects including fluidic circuits, optical circuits, and magnetic circuits. The laminate construction approach in accordance with the present invention enables manufacturing cost reductions. Miniaturization of the entire package allows unique placement of sensor applications in either folded or unfolded configurations.

As such, the present invention provides a wireless integrated folded flex microsystem capable of sensing and actuation. The system is integrated with embedded computing and standard radio frequency telemetry. The system in accordance with the present invention exhibits advantages over the current state of the art. The wireless integrated microsystem of the present invention provides an integrated system at a very low cost that is easily produced. Additionally, the wireless integrated microsystem of the present invention does not require the use of a personal computer, personal digital assistant, or equivalent for operation and use by and end user.

BRIEF DESCRIPTION OF THE DRAWINGS

For a fuller understanding of the invention, reference should be made to the following detailed description, taken in connection with the accompanying drawings, in which.

DETAILED DESCRIPTION OF THE INVENTION

Figure 1:
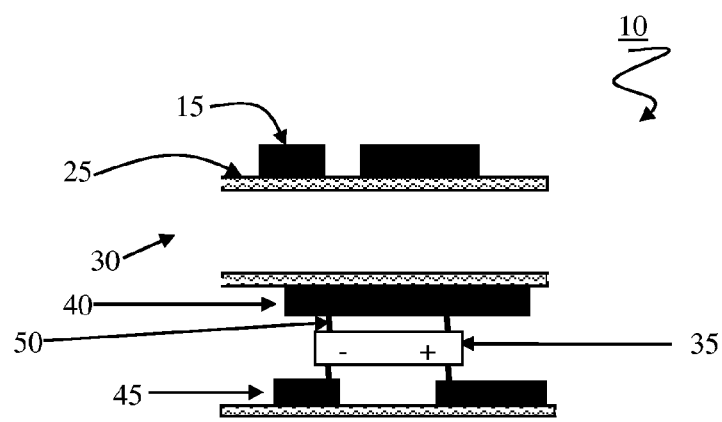
FIG. 1 is an illustrated view of a folded flex micro-electro-opto-fluidic-mechanical (MEMS) system in accordance with the present invention.

With reference to FIG. 1 is shown a folded flex micro-electro-opto-fluidic-mechanical (MEMS) system 10 in accordance with the present invention. In a particular embodiment, the folded flex MEMS system includes an 802.11b radio 15 to provide the wireless telemetry capabilities of the system. The radio 15 is in circuit communication with the other elements in the subsystem through the multilayer polyimide flex element 25, further comprising embedded passive elements, and through a single layer polyimide flex element 30. In this particular embodiment an onboard battery 35 is provided. The foldable flex system, when placed in a folded configuration, allows for vertical component-to-component interconnections between the folds of the system. Accordingly, the connectivity 50 to the battery is established between the folded layers of the system in the vertical direction. The folded flex MEMS system further includes integrated circuits 40 to provide embedded computing, thereby eliminating the need for a personal computer or personal digital assistant, and multiple MEMS sensors 45, selected as necessary for the particular application of the system. In a specific embodiment, the multilayer polyimide is embedded with passive elements and is approximately 0.2 mm in thickness and the single layer flexible polyimide is approximately 0.05 mm in thickness.

Figure 2:
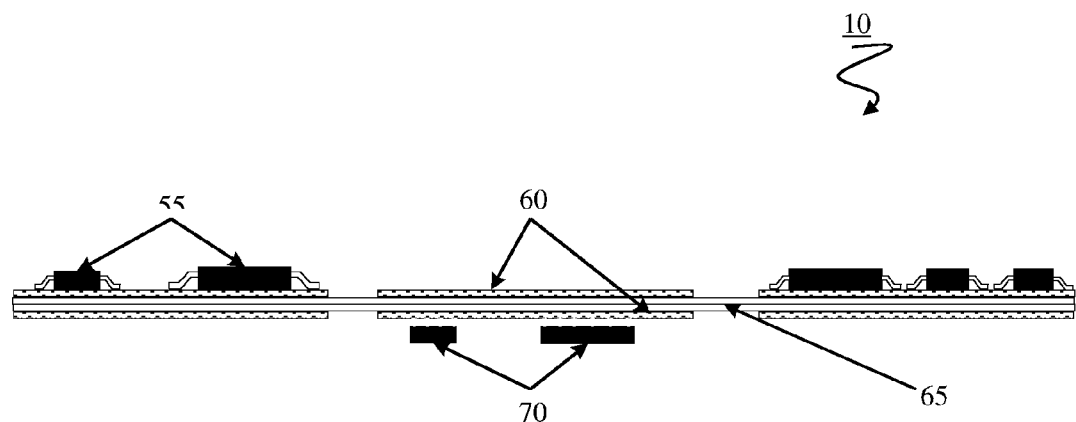
FIG. 2 is an illustrated view of an unfolded flex MEMS system in accordance with the present invention.

Referring to FIG. 2, the foldable flex micro-electro-opto-fluidic-mechanical system 10 in accordance with the present invention is shown prior to folding the system into a three-dimensional configuration. As illustrated, surface mount devices 55 and ball grid array components 70 are placed on the surface of printed circuit board 60, such as a 2-layer FR-4 printed circuit board. These devices and components are meant to be exemplary, and various other components known in the art are within the scope of the present invention, including MEMS devices. In an exemplary embodiment, the foldable flex interconnects 65 are formed of a 2-layer polyimide material. The foldable flex interconnect thereby establish the connectivity between the components.

In a specific embodiment, the present invention is employed as a sensor. As shown with reference to FIG. 3, the wireless micro-electro-opto-fluidic-mechanical foldable flex system 10 in accordance with the present invention includes a sensor element 75, a programmable microprocessor 80 and a wireless telemetry element 85 positioned on a multi-layer polyimide printed circuit board 90 with interconnections provided through single layer fold areas 95. The system may additionally include an input/output interface for additional connectivity 100. In a specific embodiment, the sensor system is approximately 32 mm in overall width and 100 mm in length.

Figure 3:
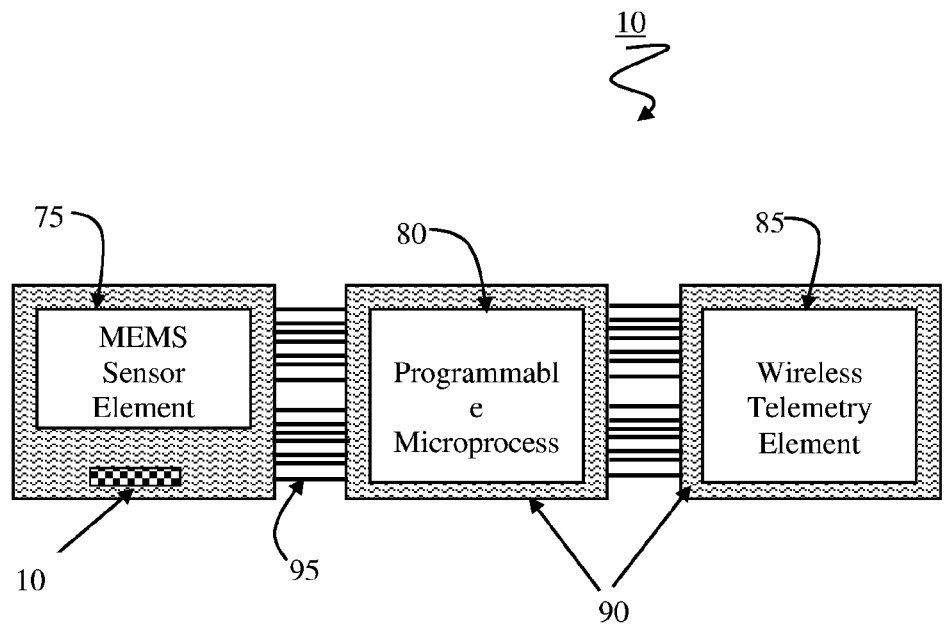
FIG. 3 is an illustrated block diagram of an unfolded flex MEMS system in accordance with the present invention when employed as a sensor.
Figure 4:
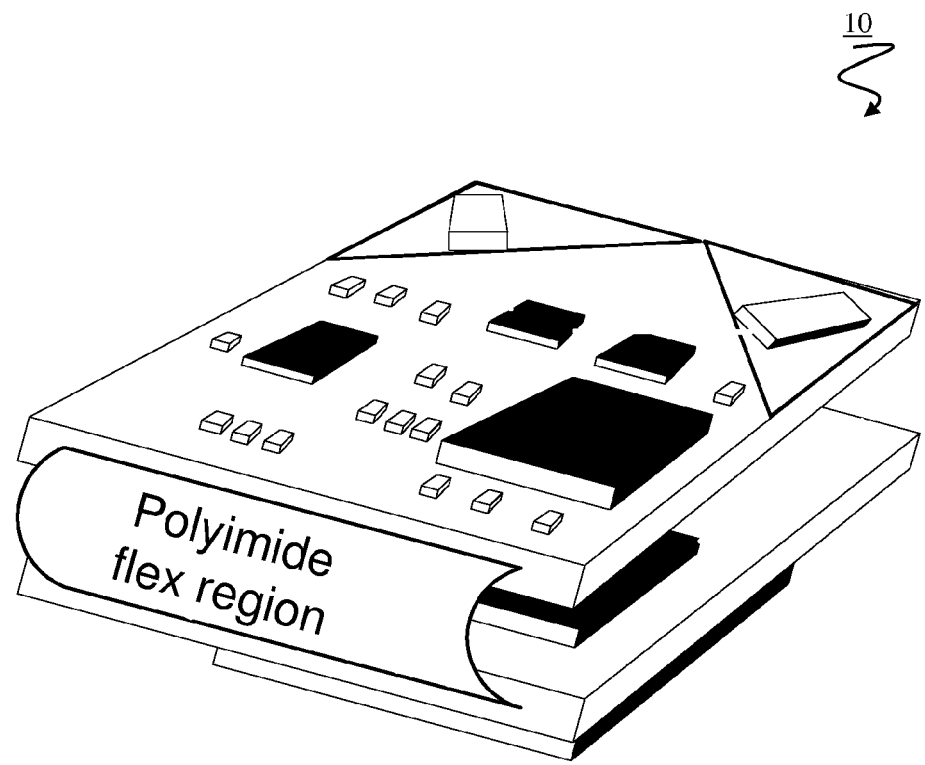
FIG. 4 is a three-dimensional view of the MEMS foldable flex system in accordance with the present invention as it would appear in the folded configuration.

FIG. 3 illustrates the wireless micro-electro-opto-fluidic-mechanical foldable flex system in accordance with the present invention as the system would appear in the folded configuration 10. In a particular embodiment, the elements of the MEMS system are fabricated on a flex or rigid-flex substrate and then folded upon itself to provide a three-dimensional system. In accordance with a specific embodiment, the folded flex MEMS system is approximately 30 mm in overall width and 8 mm in height.

As shown, the design of the MEMS system in accordance with the present invention allows the system to be folded upon itself, thereby providing a three dimensional package that includes fluidic, optical and electro/magnetic interconnects within an organic polymer substrate that connects components, sensors, actuators and subsystems into an integrated microsystem which is itself directly connected to a wireless telemetry subsystem. The use of integrated fluidic, electro/magnetic, and optical interconnect functions and wireless telemetry with embedded computing permits the creation of highly integrated wireless Microsystems that can be designed as 3D-compact, or linear tape, wireless microsensors, microactuators and microsystems for placement into various environments without the need of a personal computer or computing device that has a man-machine interface.

In accordance with one embodiment of the present invention, the integrated wireless system module is made with laminate construction of organic MEMS to make a variety of systems for different purposes.

The system in accordance with the present invention is a self-contained sensing, actuation and embedded computing system with an integrated wireless radio section. The system eliminates the need for a personal computer. The system in accordance with the present invention permits machine to machine communications within standard network protocols, such as 802.11x, Bluetooth, Zigbee and UWB. Using embedded fluidic micro channels, electro/magnetic circuits and photonic waveguides within the unit permits heterogeneous microsystems.

In a particular embodiment, the transceiver in accordance with the present invention includes a wireless local area network (WLAN) chip-set for high data rate communications, and an embedded microprocessor for on-board sensor-transceiver communications. The data rate is adjustable from 1 to 11 mega bits per second, with typical ranges from 300 to 1,000+ feet. Additionally, the range can be extended utilizing mesh network techniques as are known in the art.

In an additional embodiment, wireless telemetry conforms to 802.11b standards and thus easily integrates into existing communications/internet infrastructure. The infrastructure is inexpensive, and the architecture of the wireless unit provides for rapid development of wireless-enabled sensor products. The package provides relatively long battery life, has an extremely low profile, and allows for further miniaturization.

The wireless micro-electro-opto-fluidic-mechanical foldable flex system in accordance with the present invention is useful is a variety of target industries, including, but not limited to portable medical testing systems, automation systems, environmental control systems, security and access control systems, process analyses modules, and network data products and services.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense. It is also to be understood that the following claims are intended to cover all of the generic and specific features of the invention herein described, and all statements of the scope of the invention which, as a matter of language, might be said to fall therebetween. Now that the invention has been described,

What is claimed is:

1. A wireless integrated foldable flex microsystem comprising:
   a programmable microprocessor mounted on a first multi-layer printed circuit board;
   at least one microelectronic element mounted on a second multi-layer printed circuit board;
   a wireless telemetry element mounted on a third multi-layer printed circuit board, the wireless telemetry element for receiving data from the at least one microelectronic element and for transmitting the received data to a remote receiving station; and
   a flexible bi-directional liquid crystal polymer interconnect comprising at least one etched non-electrical interconnect and at least one etched electrical interconnect, the flexible bi-directional liquid crystal polymer interconnect positioned between the layers of the first circuit board, second circuit board and third circuit board and a portion of the flexible bi-directional liquid crystal polymer interconnect extending across a space between said circuit boards, the extending portion of the flexible bi-directional liquid crystal polymer interconnect affording foldability of the microsystem.

2. The system of claim 1, wherein the programmable microprocessor further comprises circuitry to establish wireless connectivity to the internet employing the wireless telemetry element.

3. The system of claim 1, wherein the microelectronic element is a MEMS sensor.

4. The system of claim 1, wherein the microelectronic element is a MEMS actuator.

5. The system of claim 1, further comprising a programmable last metal interconnect grid to accept the microelectronic element.

6. The system of claim 1, wherein the flexible bi-directional liquid crystal polymer interconnects further comprise embedded passive circuit elements.

7. The system of claim 1, wherein the at least one etched non-electrical interconnect is a fluidic interconnect.

8. The system of claim 1, wherein the at least one etched non-electrical interconnect is an optical interconnect.

9. The system of claim 1, wherein the at least one etched non-electrical interconnect is a photonic waveguide interconnects.

10. The system of claim 1, further comprising at least one integrated circuit in circuit communication with the programmable microprocessor through the flexible bi-directional liquid crystal polymer interconnects.

11. The system of claim 1, wherein the wireless telemetry element is an 802.11b wireless telemetry element.

12. The system of claim 1, further comprising a battery element in circuit communication with the programmable microprocessor.

13. The system of claim 1, wherein the foldable flex system placed in a folded configuration allows for vertical component-to-component interconnections between the folds of the system.

14. The system of claim 1, further comprising an external antenna coupled to the wireless telemetry element.

15. The system of claim 1, wherein the at least one etched non-electrical interconnect is a magnetic interconnects.

16. The system of claim 1, wherein at least one of the microprocessor, the microelectronic element or the wireless telemetry are mounted on the same circuit board.

* * * * *